(12) United States Patent
Mulder et al.

(10) Patent No.: US 11,860,789 B2
(45) Date of Patent: Jan. 2, 2024

(54) REDUCED SIMULATION VERIFICATION COMPLEXITY OF CACHE PURGE

(71) Applicant: International Business Machines Corporation, Armonk, NY (US)

(72) Inventors: Yvo Thomas Bernard Mulder, Reutlingen (DE); Ralf Ludewig, Boeblingen (DE); Huiyuan Xing, Schwieberdingen (DE); Ulrich Mayer, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 17/699,279

(22) Filed: Mar. 21, 2022

(65) Prior Publication Data

US 2023/0297509 A1 Sep. 21, 2023

(51) Int. Cl.
*G06F 12/08* (2016.01)
*G06F 12/0864* (2016.01)

(52) U.S. Cl.
CPC ...... *G06F 12/0864* (2013.01); *G06F 2212/60* (2013.01)

(58) Field of Classification Search
None
See application file for complete search history.

(56) References Cited

U.S. PATENT DOCUMENTS

| 5,363,496 | A * | 11/1994 | Kato | G06F 12/0891 711/135 |
|---|---|---|---|---|
| 9,798,597 | B1* | 10/2017 | Duale | G06F 12/1036 |
| 2003/0220984 | A1* | 11/2003 | Jones | H04L 67/51 709/219 |
| 2011/0320732 | A1* | 12/2011 | Ambroladze | G06F 12/126 711/135 |
| 2017/0091096 | A1* | 3/2017 | Mccarthy | G06F 12/128 |
| 2018/0373657 | A1 | 12/2018 | Klein | |
| 2019/0251037 | A1* | 8/2019 | Ambroladze | G06F 12/0864 |
| 2020/0341902 | A1* | 10/2020 | Ambroladze | G06F 12/0891 |
| 2023/0251966 | A1* | 8/2023 | Desai | G06F 12/123 711/118 |

* cited by examiner

*Primary Examiner* — Tracy C Chan
(74) *Attorney, Agent, or Firm* — Matthew Zehrer (57) ABSTRACT

A cache purge simulation system includes a device under test with a cache skip switch. A first cache skip switch includes a configurable state register to indicate whether all of an associated cache is purged upon receipt of a cache purge instruction from a verification system or whether a physical partition that is smaller than the associated cache is purged upon receipt of the cache purge instruction from the verification system. A second cache skip switch includes a configurable start address register comprising a start address that indicates a beginning storage location of a physical partition of an associated cache and a configurable stop address register comprising a stop address that indicates a ending storage location of the physical partition of the associated cache.

18 Claims, 6 Drawing Sheets

| Skip Ahead Switch | Simulated Purge Sequence (number of cycles) | | | | | | | | | | Average |
|---|---|---|---|---|---|---|---|---|---|---|---|
| No Skip | 1180234 | 1180526 | 1180810 | 1181062 | 1181666 | 1182110 | 1182110 | 1185182 | 1192690 | 1193430 | 1184228 |
| Skip | 6226 | 6438 | 6526 | 6718 | 6810 | 7846 | 7874 | 8298 | 8974 | 9174 | 7488 |

*FIG. 8*

REDUCED SIMULATION VERIFICATION COMPLEXITY OF CACHE PURGE

BACKGROUND

Various embodiments of the present application generally relate to the field of information handling. More specifically, various embodiments of the present application relate to a verification environment performing a cache purge simulation upon a subset or physical partition of a cache of a device under test.

SUMMARY

In an embodiment of the present invention, a cache purge simulation system is presented. The cache purge simulation system includes a device under test that includes a cache skip switch. The cache skip switch includes a configurable state register to indicate whether all of an associated cache is associatively purged or whether a physical partition that is smaller than the associated cache is associatively purged.

In an embodiment of the present invention, another cache purge simulation system is presented. The cache purge simulation system includes a device under test that includes a cache skip switch. The cache skip switch includes a configurable start address register comprising a start address that indicates a beginning storage location of a physical partition of an associated cache and a configurable stop address register comprising a stop address that indicates a ending storage location of the physical partition of the associated cache. Only the physical partition of the associated cache is purged upon receipt of a cache purge instruction from a verification system. The physical partition is smaller than the associated cache.

In another embodiment of the present invention, a cache purge simulation process is presented. The process includes sending, with a verification system, an active skip switch state instruction to a device under test. The process further includes sending, with the verification system, a cache purge instruction to the device under test. The process further includes purging, with the device under test, storage locations comprised within the physical partition and not purging storage locations within the cache that are not comprised within the physical partition. The process further includes sending, with the device under test, a purge done signal to the verification system.

These and other embodiments, features, aspects, and advantages will become better understood with reference to the following description, appended claims, and accompanying drawings.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, process, or device. Finally, like reference numerals may be used to denote like features throughout the specification and figures.

DETAILED DESCRIPTION

Zero downtime (e.g., resilient computing, etc.) is a differentiating feature of some high performance information handling systems. A foundational building block of many resilient information handling system technologies is the purging of its cache(s). For example, memory in a running system can be reallocated between multiple processors within the same information handling system or between multiple processors in different but computationally related information handling systems. As part of these memory reallocation techniques, the applicable processors' cache(s) are typically purged.

A traditional cache purge sequence will clear all valid entries inside a cache and cast out data stored therein that is dirty (i.e., data that has been modified within the cache, but memory stores old data). At the end of a traditional cache purge sequence, the entire cache contains non-valid entries and memory contains the newest data.

To test or verify the resiliency of an information handling system, prior to the system's intended or ultimate field of use, a cache purge simulation may ensure that its cache purge operations or features are working. Such simulations take an increasing amount of time, due to ever-growing cache sizes (e.g., millions of simulation cycles are currently needed to complete a single cache purge simulation).

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, circuits, or the like, have not been described in exhaustive detail so as not to unnecessarily obscure more pertinent aspects of the embodiments described herein.

Figure 1:
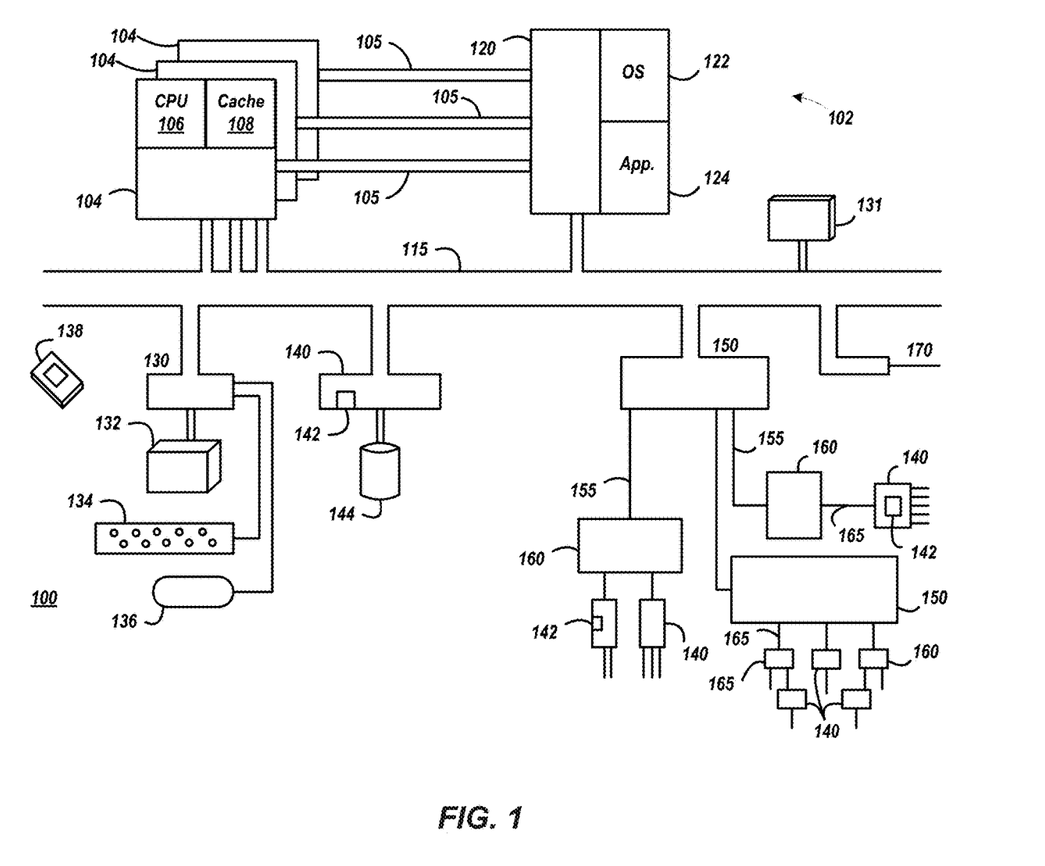
FIG. 1 is a block diagram illustrating an information handling system, in accordance with some embodiments.

FIG. 1 illustrates components and an interconnection topology for an information handling system, for example a computer system 100, that may utilize one or more embodiments the present invention. Computer system 100 may comprise a host 102 having multiple processors 104. Each processor 104 may be connected to a memory 120 by an internal bus 105 and/or a host system bus 115. Each processor 104 has at least one general-purpose programmable processor unit (CPU) 106 that may execute program instructions stored in memory 120. Although a multiple processors 104 are shown in FIG. 1, it should be understood that a computer system may include a single processor 104. Cache 108 may be physically included within each processor 104. Together the cache 108 and memory 120 may make up a known hierarchy of one or more levels of on board cache and off board memory.

Memory 120 may be for example a random access memory for storing data and/or program instructions, such as an operating system or application. Though cache 108 and memory 120 are shown conceptually as a single monolithic entity, cache 108 and/or memory 120 may be arranged as a hierarchy of caches and other memory devices, respectively. Memory 120 may include operating system (OS) 122 and applications (Apps) 124. Operating system 122 may provide functions such as device drivers or interfaces, management of memory pages, management of multiple tasks, etc., as is known in the art. Applications 124 may for example include a server software application whereby a network interface 170 may interact with the server software application to enable computer system 100 to be a network server.

Host system bus 115 may support the transfer of data, commands, and other information between the host processor system 102 and peripheral or external devices attached to it, and communication of data which may occur between the external devices independent of the host processor complex 102. While shown in simplified form as a single bus, the host system bus 115 may be structured as multiple buses which may be for example hierarchically arranged. Host system bus 115 may be connected to other components integral to the computer system 100 (such as a touch screen 131, touch pad, etc.) and/or to a myriad of external or peripheral devices through a connection hub 130, through an adapter 140, a multifunction adapter 150, or through network interface 170.

These peripheral devices may include a monitor or display 132, a keyboard 134, a mouse or other handheld device 136, and/or a printer 138. Display 132 may be a cathode-ray tube display, a flat panel display, or a touch screen, or other display technology. One or more adapters 140 may support keyboard 134 and mouse 136; it being understood that other forms of input devices could be used. The number and types of devices shown in FIG. 1 are illustrative only and ordinary users of computer systems now know that a great variety of connected devices exist; e.g., microphones, speakers, infrared remote controls, wireless connected devices, etc. and therefore computer system 100 is not limited to those devices illustrated in FIG. 1.

The host system bus 115 may also be connected to an adapter 140 (e.g., an I/O adapter connected to an external memory device 144). External memory device 144 may be a disk storage, rotating or static optical storage, magnetic tape storage, FLASH storage, etc. based storage or memory device. Adapter 140 may include adapter microcode or firmware and decision logic which may be embodied as a message processor 142. The adapter 140 may also be provided with at least one fast nonvolatile write cache, queues, interrupt registers connected to the message processor 142 and/or decision logic. The message processor 142 may process incoming messages from the host processor complex 102 and generate and transmit response messages back to the host processor complex 102.

The adapter 140 may contain electronic components and logic to adapt or convert data of one protocol on one bus to another protocol on another bus. Therefore, adapter 140 may connect a wide variety of devices to the host computer system 102 and to each other such as, but not limited to, tape drives, optical drives, printers, disk controllers, other bus adapters, PCI adapters, workstations using one or more protocols including, but not limited to, Token Ring, Gigabyte Ethernet, Ethernet, Fibre Channel, SSA, Fiber Channel Arbitrated Loop (FCAL), Serial SCSI, Ultra3 SCSI, Infiniband, FDDI, ATM, 1394, ESCON, wireless relays, Twinax, LAN connections, WAN connections, high performance graphics, etc.

The host system bus 115 may also be connected to a multifunction adapter 150 to which more I/O devices may be connected either directly, or through one or more bridge devices 160, or through another multifunction adapter 150 on either a primary bus 155 or a secondary bus 165. Various components may be connected to the primary bus 155 including, for example, an adapter 140, a bridge device 160, or another multifunction I/O processor or a multifunction adapter 150. The bridge device 160 bridges the primary bus 155 and a secondary bus 165 to which various adapters 140 may be connected. The adapters 140, the primary bus 155, and the secondary bus 165 may conform to the PCI/PCI-X or other industry bus specification. One skilled in the art realizes, however, that the implementation is not limited to a PCI/PCI-X or a SCSI or USB bus implementation but is applicable to any electrical, optical, or wireless bus where data must be efficiently transferred.

Network interface 170 provides an operative connection for transmission of data to and from a network. The network may be an internet but could also be any smaller self-contained network such as an intranet, a WAN, a LAN, or other internal or external network using; e.g., telephone transmission lines, cable services, satellites, fiber optics, T1 lines, wireless, Bluetooth, etc., and any other various technologies.

Finally, computer system 100 need not be a computer at all, but may be a simpler appliance-like client device with less memory such as a network terminal, a thin client, a terminal-like device, a voice response unit, etc. The convergence of computing, telecommunications and consumer electronics is causing a tremendous growth in the number and variety of pervasive mobile devices as clients. This mobile architecture enables the multitude of clients including laptops, sub-notebooks, handheld computers such as personal digital assistants and companion devices, and mobile appliances such as smartphones, pages, simple messaging devices and wearable devices. Thus, when the computer system 100 is a mobile device, the adapters 140 and network interfaces 170 may support a variety of multi-modal interfaces including traditional keyboard and mouse interfaces, small text screens, pen, touch screens, speech recognition, text-to-speech, and/or wearable devices.

The computer system 100 is intended to be a simplified representation, it being understood that many variations in system configuration are possible in addition to those specifically mentioned here. While computer system 100 could conceivably be a personal computer system, the computer system 100 may also be a larger computer system such as a general purpose server. Computer system 100 and its components are shown and described in FIG. 1 above as a more or less a single, self-contained computer system.

Various embodiments of the present invention pertain to processes that may be implemented upon or by a single computer system 100 or may be implemented upon multiple computer systems 100. When computer system 100 performs particular as directed from the program instructions stored in memory 120, such computer system 100 in effect becomes a special purpose computer particular to the various processes as described further herein.

Figure 2:
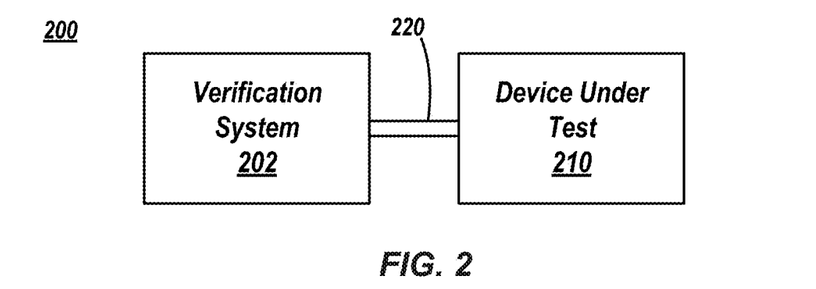
FIG. 2 is a block diagram illustrating a verification environment, in accordance with some embodiments.

FIG. 2 is a block diagram illustrating verification environment 200, in accordance with some embodiments. Verification Environment 200 may include a verification system 202 and a device under test 210 communicatively connected by an communication interconnect 220. In one embodiment, verification system 202 and device under test 210 may be separate instances of computer system 100. In another embodiment, verification system 202 may be a computer system 100 and device under test 210 may be a processor 104. In another embodiment, verification system 202 may be a hardware device such as a field programmable gate array (FPGA) and device under test 210 may be processor 104.

In another embodiment, verification environment 200 include software instances of verification system 202 and device under test 210. For example, verification environment 200 may be a simulated hardware environment where one or more components of the device under test 210 are modeled in a hardware description language and the verification system 202 takes the form of a verification and/or cache purge simulation application 124. In this embodiment, the modeled one or more components of the device under test 210 and verification application 124 may be called or evoked by the processor 104 of the same or single computer 100. Alternatively in this embodiment, the modeled one or more components of the device under test 210 may be called or evoked by a processor 104 of a first computer 100 and the verification application 124 may be called or evoked by a processor 104 of a different second computer 100.

Communication interconnect 220 are one or more communication pathways that connect the verification system 202 and a device under test 210. For example, communication interconnect 220 may include data passing or handling between software entities, may include communication hardware such as network interface 170, adapter 140, multifunction adapter 150, connection hub 130, and/or host system bus 115 of the first computer system 100, or the like.

To test or verify the resiliency of the device under test 210, a cache purge simulation application 124 may be called by the processor 104 of the verification system 202 to cause the verification system 202 to perform a series of operational steps, further described herein, on the verification system 202 and/or the device under test 210. The cache purge simulation application 124 may utilize a cache skip switch 300, 301 shown for example in FIG. 4 or FIG. 5, respectively, within the processor 104 of the device under test 210 to purge the entire cache 108 if the cache skip switch 300, 301 is not enabled or alternatively purge only a subset or physical partition of the cache 108 of the device under test 210 if the cache skip switch 300, 301 is enabled.

Figure 3:
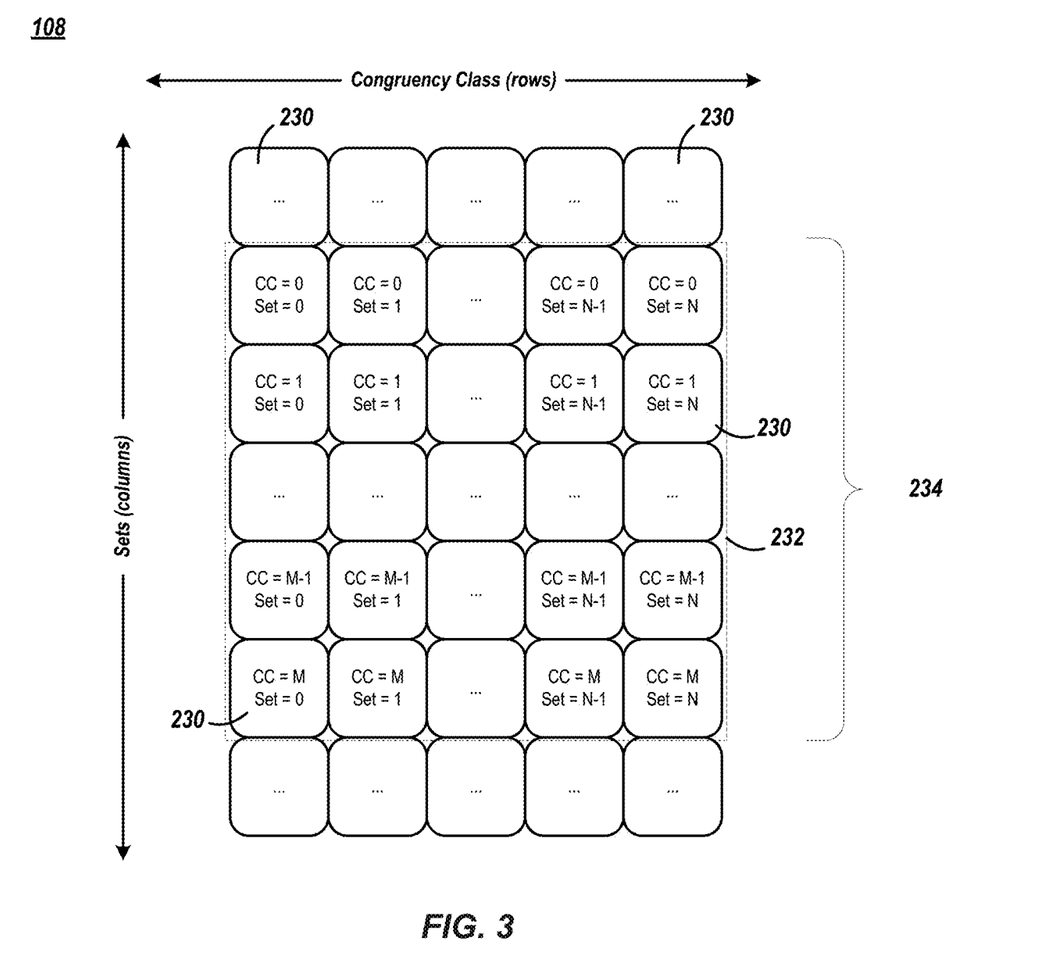
FIG. 3 is a block diagram illustrating a cache arranged with congruence classes and sets, in accordance with some embodiments.

FIG. 3 is a block diagram illustrating cache 108 of device under test 210, in accordance with some embodiments. Cache 108 may include multiple storage locations 230 which may be physically and/or logically arranged in rows, columns, congruency classes, and/or sets. Each storage location 230 may include multiple memory cells that are each configured to store one bit of data (e.g., store a "1", or a "0", etc.). Each memory cell may be identified by a unique identifier, such as an address, etc. Likewise, a subset or series of memory cells within the storage location 230 may be identified by a unique identifier. Similarly, all the memory cells within the storage location 230 may be identified by a unique identifier. For example, as depicted, the entire set of memory cells within storage location 230 may be identified by a congruency class identifier and a set identifier.

The storage locations 230 that share the same concurrency class identifier may be in the same physical or logical row of cache 108 and the storage locations 230 that share the same set identifier may be in the same physical or logical column of cache 108. For clarity, neighboring or sequential logical storage locations 230 may be physically far apart and not physically neighboring one another.

In an embodiment, when cache skip switch 300, 301 is enabled, cache skip switch 300 defines or otherwise identifies a physical subset or physical partition 232 of the cache 108. Similarly, when cache skip switch 300, 301 is not enabled, cache skip switch 300 defines or otherwise identifies the entire cache 108. Generally, the partition 232 includes fewer than the total number of storage locations 230 within cache 108. As depicted, the partition 232 may be defined as a series of consecutive congruency classes. The physical partition 232 may define the storage locations 230 within the cache 108 that cache purge simulation application 124 perform cache purge simulation, verification, and/or test operations. When placed in the enabled state by the skip switch 300, 301, unique identifiers of the storage locations 230 within the partition 232 may define the cache entries 234. In this manner, because partition 232 includes fewer storage locations 230 relative to the entire cache 108, cache purge simulation application 124 perform cache purge simulation, verification, and/or test operations on an effectively smaller cache, thereby reducing the time to completion.

Figure 4:
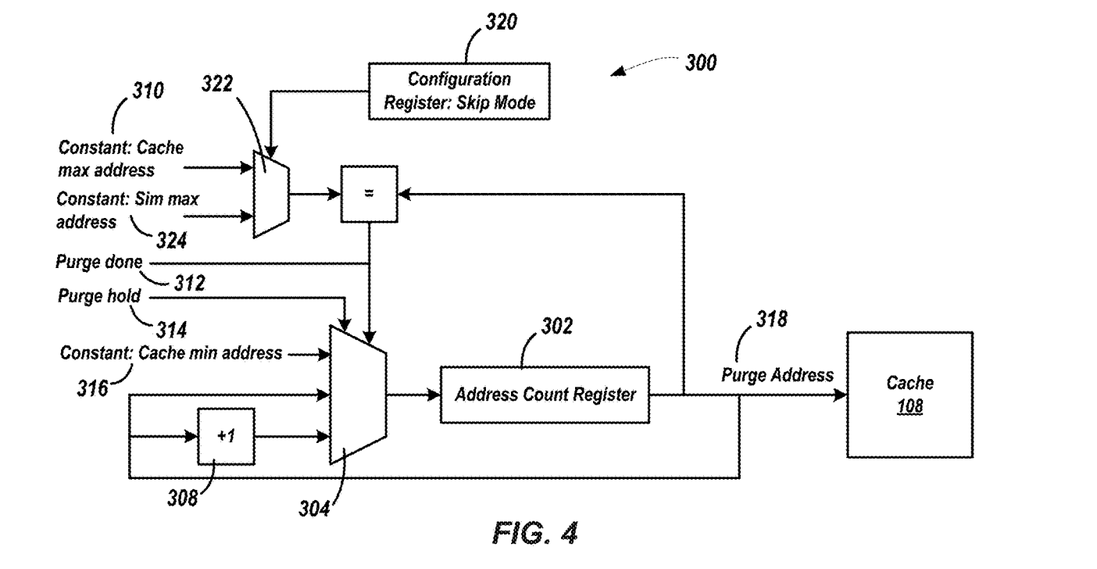
FIG. 4 and FIG. 5 are block diagrams illustrating respective cache skip switch circuits, in accordance with some embodiments.

FIG. 4 illustrates an implementation of a cache purge circuit that includes cache skip switch 300, in accordance with some embodiments. As depicted, the cache purge circuit may include an address count register 302, multiplexer 304, comparator 306, incrementor 308, a constant cache maximum address signal 310, a purge done signal 312, a purge hold signal 314, a constant cache minimum address signal 316, a purge address signal 318, skip configuration register 320, multiplexer 322, and a purge simulation max address signal 324. The cache skip switch 300 may include configuration register 320, purge simulation max address signal 324, multiplexer 322, etc.

Purge hold signal 314 may be an internal signal utilized by device under test 210 and may identify whether a purge simulation and/or purge signal is being called by e.g., cache purge simulation application 124. If cache purge simulation application 124 is inactive, purge hold signal 314 may be held in a reset state (e.g., purge hold signal 314=1). In this state, the address counter register 302 may be preloaded with the constant cache min address identified by the constant cache minimum address signal 316. If cache purge simulation application 124 is active, purge hold signal 314 may be held in an active state (e.g., purge hold signal 314=0). When a purge command is received by the host complex 102 within the device under test 210, the purge hold signal 314 may be changed to the active state and the storage location 230 that is identified by the address within the address counter register 302 is purged. The address within the address counter register 302 may be sequentially advanced by incrementor 308 and the storage location 230 identified thereby (i.e., storage location 230 identified by purge address signal 318) may be purged.

The address within the address counter register 302 may be sequentially compared by comparator 306 with either constant cache maximum address signal 310 or with the simulation max address signal 324 as is outputted from multiplexer 322 as indicated by the state of skip configuration register 320 and advanced by incrementor 308 (and the associated storage location 230 associated therewith purged) until the currently purged storage location 230 is identified by the constant cache maximum address signal 310 or the simulation max address signal 324. Skip configuration register 320 may receive an input from verification system 202 and which sets its internal state to indicate either an active or inactive skip state. If the skip state is active, only partition 232 may be subjected to cache purges. If the skip state is inactive, the entire cache 108 may be subjected to cache purges.

When the storage location 230 associated with the cache maximum address signal 310 or with the simulation max address signal 324 is purged, respectively as is dictated by the skip configuration register 320, the purge done signal 312 may be sent to the verification system 202 and the purge hold signal 314 may be again held in the reset state.

For clarity, is to be understood that cache skip switch 300 may be configured to identify and purge all storage locations 230 within cache 108 or only a partition 230 of storage locations 230 within cache 108, as is dictated by the state of the configuration register 320. In these embodiments, the partition 232 may begin at the storage location 230 associated with the cache minimum address signal 316 and ends at a storage location 230 associated with the simulation max address signal 324.

Figure 5:
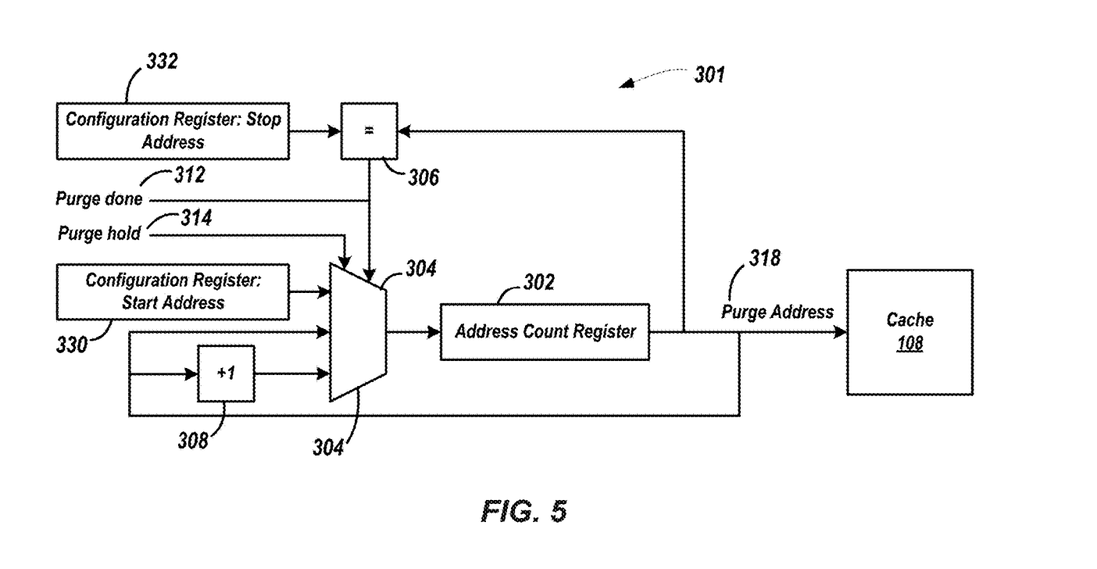

FIG. 5 illustrates an implementation of a cache purge circuit that includes cache skip switch 301, in accordance with some embodiments. As depicted, the cache purge circuit may include an address count register 302, multiplexer 304, comparator 306, incrementor 308, a start address configuration register 330, an end address configuration register 332, a purge done signal 312, a purge hold signal 314, and a purge address signal 318. Cache skip switch 301 may include start address configuration register 330, end address configuration register 332, etc.

Purge hold signal 314 may be an internal signal utilized by device under test 210 and may identify whether a purge simulation and/or purge signal is being called by e.g., cache purge simulation application 124. If cache purge simulation application 124 is inactive, purge hold signal 314 may be held in a reset state (e.g., purge hold signal 314=1). In this state, the address counter register 302 may be preloaded with the starting storage location 230 address identified by the start address configuration register 330. If cache purge simulation application 124 is active, purge hold signal 314 may be held in an active state (e.g., purge hold signal 314=0). When a purge command is received by the host complex 102 within the device under test 210, the purge hold signal 314 may be changed to the active state and the storage location 230 that is identified by the address within the address counter register 302 is purged. The address within the address counter register 302 may be sequentially advanced by incrementor 308 and the storage location 230 identified thereby (i.e., storage location 230 identified by purge address signal 318) may be purged.

The address within the address counter register 302 may be sequentially compared by comparator 306 with the address identified by the stop address configuration register 332 and advanced by incrementor 308 (and the associated storage location 230 associated therewith purged) until the currently purged storage location 230 is identified by the stop address configuration register 332. When the storage location 230 associated with the stop address configuration register 332 is purged, the purge done signal 312 may be sent to the verification system 202 and the purge hold signal 314 may be again held in the reset state.

For clarity, is to be understood that the depicted cache skip switch 301 may be configured to identify and purge all storage locations 230 within cache 108 (i.e., if the address as indicated by start address configuration register 330 equals the cache minimum address signal 316, if the address as indicated by stop address configuration register 332 equals the cache max address signal 310). Further it is to be understood that the depicted cache skip switch may be configured to identify and purge only a partition 230 of storage locations 230 within cache 108 as is dictated by respective addresses if start address 330 and stop address 332 (if the address as indicated by start address configuration register 330 does not equal the cache minimum address signal 316, if the address as indicated by stop address configuration register 332 does not equal the cache max address signal 310).

For clarity, the cache skip switch 300, 301 may be included in hardware generally located in the host processor complex 102 of the device under test 210. For example, cache skip switch 300, 301 may be included within processor 104, CPU 106, etc. of the device under test 210.

Figure 6:
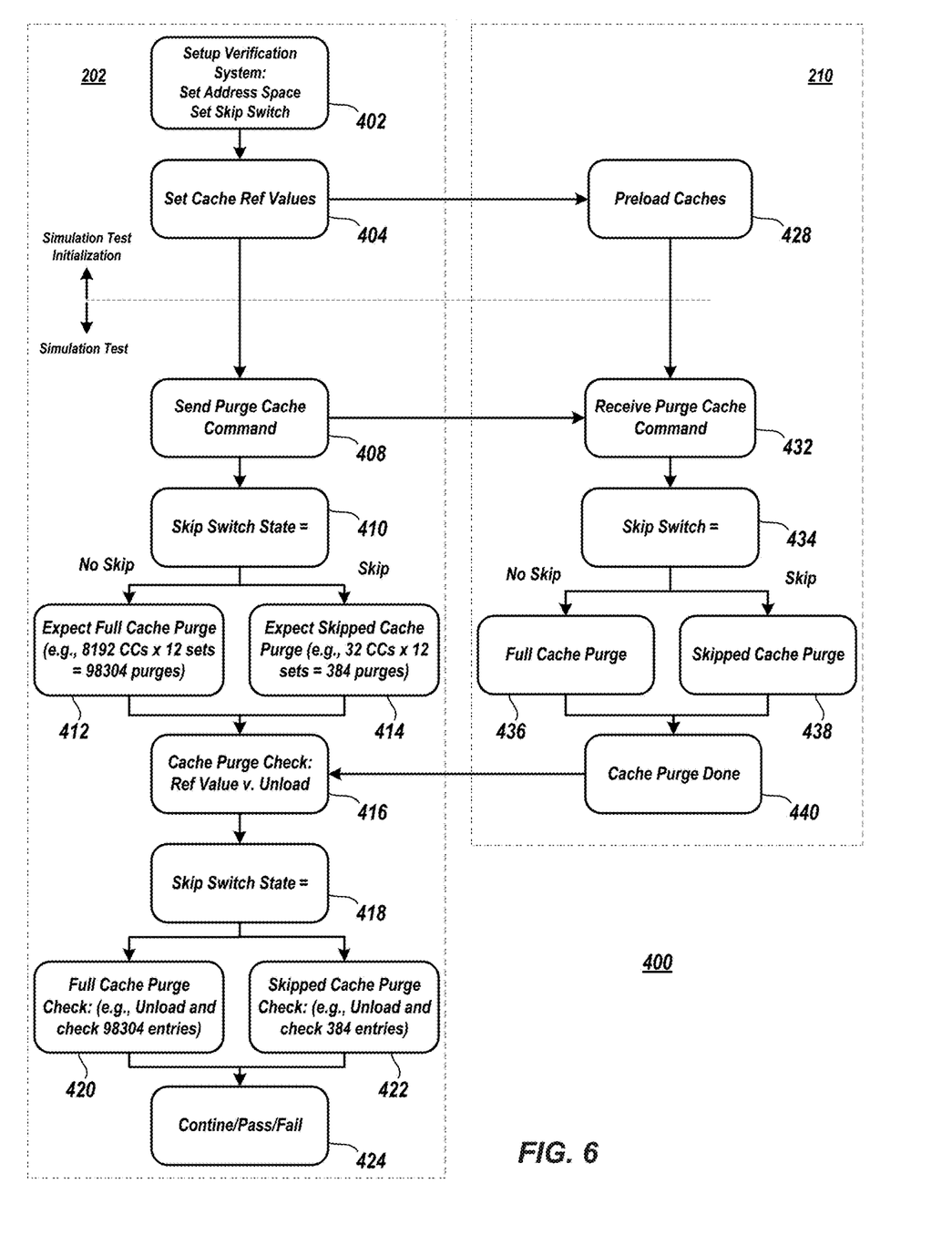
FIG. 6 illustrates a flow diagram of a cache purge verification process, in accordance with some embodiments.

FIG. 6 illustrates a flow diagram of cache purge verification process 400, in accordance with some embodiments. Cache purge verification process 400 may be utilized in unison by both the verification system 202 and the device under test 210. When enabled, the device under test 210 is hardwired to purge a predetermined number of congruency classes. An additional or multiple cache skip switches 300, 301 may be utilized to change the number of congruency classes to be purged or configure a range of congruency classes to be purged.

Process 400 begins with the verification system 202 sets up the cache purge simulation (block 402). For example, verification system 202 may set a simulation address space and decide on if the skip switch 300, 301 is enabled.

In some embodiments, the simulation address space is a mapping of an address to a cache line (data). The simulation address space can range from a handful to thousands of addresses and associated data generated and associated therewith. The simulation address space can be randomly chosen addresses and data, or biased, based on an predefined algorithm, or the like. In a particular implementation, the simulation address space may be biased to generate multiple addresses and associated data only within cache partition 232, if skip switch 300, 301 is enabled.

Process 400 may continue with the verification system 202 determining, setting, or obtaining the cache reference values (block 404). For example, verification system 202 may obtain the reference values from the simulation address space. Further, verification system 202 may select the addresses and associated data are to be written into cache 108 of the device under test 210. This selection process can be random, biased, algorithm. For example, the simulation address space might define ten addresses and associated data that map to cache CC=0. If the cache has 12 sets, then all entries fit into cache 108. However, verification system 202 at block 404 might be biased to write only half of the generated addresses and associated data into device under test 210. Further, verification system 202 may select a set to which the cache line (data) is written into. This selection process can be random, biased, and/or algorithmically based.

Process 400 may continue by verification system 202 directly writing refence values to the appropriate memory locations 230 within device under test 210 (block 428). Alternatively, verification system 202 may send the reference values to the device under test 210, whereby the device under test 210 writes the reference value to the associated storage location 230 within its cache 108 (block 428). The reference values may be written to the entire cache 108 independent of the state of the skip switch 300, 301. The simulation address space may be biased to partition 232 and only contain addresses for partition 232 if the state of the skip switch 300, 301 is active. The simulation address space may be not biased and contain addresses for memory locations 230 both inside partition 232 and outside partition 232. As such, the verification system 202 knows or otherwise maps a predetermined reference value(s) to an assigned or specific storage location 230 within the cache 108 of the device under test 210.

Process 400 may continue with the verification system 202 sending a purge command or instruction to the device under test 210 (block 408) which is received by the device under test 210 (block 432).

Process 400 may continue with the device under test 210 determining whether a full cache 108 purge should be completed or whether a skipped or partial cache 108 purge should be completed in response to the received purge command (block 434). The device under test 210 may make such determination by its internal state designated within register 320, by the start address register 330 and the stop address register 330, or the like. If the cache skip switch 300 is utilized, the skip state is active within register 320 when only partition 232 is subjected to cache 108 purge (block 438) and the skip state is inactive within register 320 when the entire cache 108 is subjected to cache 108 purge (block 436). If the cache skip switch 301 is utilized, the skip state is active when the start address and end address within the respective register define partition 232 and not the entire cache 108 and the partition 232 is subjected to cache 108 purge (block 438) and the skip state is inactive when the start address and end address within the respective register defines the entire cache 108 and the entire cache 108 is subjected to cache 108 purge (block 436). The cache skip switch 300, 301, then purges the appropriate storage locations 230 within the device under test 210 as described above and the device under test 210 returns a cache purge done signal 312 to the verification system 202 (block 440).

Process 400 may continue with the verification system 202 determining whether to expect a full cache 108 purge or whether a skipped or partial cache 108 purge should be expected in response to the received purge command (block 410). The verification system 202 may make such determination by the read internal state of the applicable skip switch 300, 301, as is designated within register 320, by the start address register 330 and the stop address register 330, or the like.

If the cache skip switch 300 is utilized, the skip state is active within register 320 when only partition 232 is subjected to cache 108 purge and verification system 202 should expect a skipped cache purge (block 414). For example, verification system 202 may expect around 384 purges from partition 232 that includes 32 congruency classes and 12 sets of the device under test 210. Further, if the cache skip switch 300 is utilized, the skip state is inactive within register 320 when the entire cache 108 is subjected to cache 108 purge and verification system 202 should expect a full cache purge (block 412). For example, verification system 202 may expect around 98,304 purges from the full cache 108 that includes 8192 congruency classes and 12 sets of the device under test 210.

If the cache skip switch 301 is utilized, the skip state is active when the start address and end address within the respective register define partition 232 and not the entire cache 108 and the partition 232 is subjected to cache 108 purge and verification system 202 should expect a skipped cache purge (block 414). Further, if the cache skip switch 301 is utilized, the skip state is inactive when the start address and end address within the respective register defines the entire cache 108 and the entire cache 108 is subjected to cache 108 purge and verification system 202 should expect a full cache purge (block 412). The verification system 202 may subsequently expect receipt of the associated cache purge done signal 312 which may trigger purge check, unloading and verification, or the like (block 416).

Process 400 may continue with the verification system 202 determining whether to expect a full cache 108 purge or whether a skipped or partial cache 108 purge should be expected in response to the received purge command (block 418). The verification system 202 may make such determination by reading the internal state of the applicable skip switch 300, 301, as is designated within register 320, by the start address register 330 and the stop address register 330, or the like.

If the device under test 210 purged the full cache 108, the verification system checks the purge by unloading the purged data and verifying the purged data against the original predetermined reference values (block 420). For example, the verification system 202 unloads the 98,308 entries of the purged data from the full cache 108 of the device under test and compares the purged data against the original predetermined reference values (block 420).

If the device under test 210 purged merely the partition 232 of cache 108, the verification system purge checks by unloading only the purged data from the partition 232 storage locations 230 and verifying the purged data against the original predetermined reference values. For example, the verification system 202 unloads the 384 entries of the purged data from the partition 232 of the device under test and compares the purged data against the original predetermined reference values. In other words, if the skip state is active within the cache skip switch 300, 301, only the predetermined/configured CCs are purged and subsequently checked for valid entries. Process 400 may continue at block 424 with continuing purge verification operations, with determining the purge verification has passed, failed, or the like (block 424).

Figure 7:
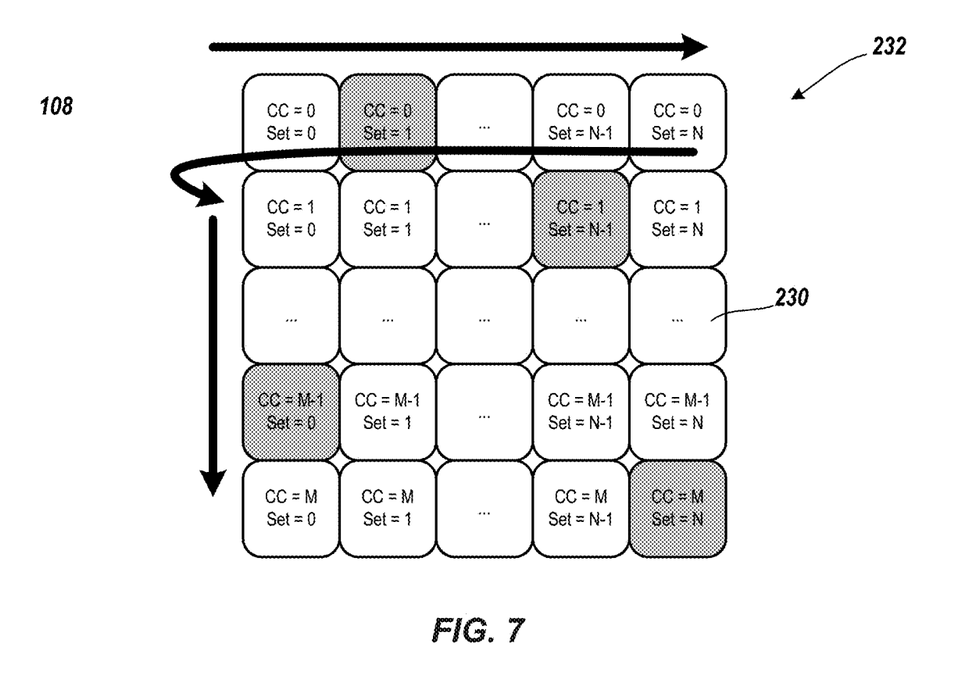
FIG. 7 illustrates a cache purge verification process, in accordance with some embodiments.

FIG. 7 illustrates a cache purge verification example of cache 108 partition 230, in accordance with some embodiments. The verification example may begin by the verification system 202 setting the state of skip switch 300, 301 within the device under test 210. The state of skip switch 300, 301 may be either a full cache 108 purge state such that the device under test 210 purges all storage locations 230 within cache 108 or a skipped cache 108 purge state such that the device under test 210 to purge the subset or partition 232 of storage locations 230 within cache 108.

Further, the verification system 202 sets the simulation address space with four addresses (e.g., 0x0:00008000, 0x0:00010000, 0x0:00018000, 0x0:00020000) and writes corresponding refence data thereto (block 428). Verification system 202 may load or write reference values to only memory locations 230 that are defined by the simulation address space, to all memory locations 230 that are defined within the partition 232, to only some partition memory locations 230 that are defined within the partition 232, or the like.

In a particular implementation, verification system 202 may only load and/or unload data stored in those predefined memory locations 230 defined within partition 232. As indicated herein, either the entire cache 108 is purged or the partition 232 is purged depending upon the state of skip switch 300, 301. In the embodiments where the skip switch 300, 301 is active, after the purge sequence, cache 108 might still have valid data within some storage locations 230 that are located outside of the partition 232.

In this cache purge verification example, the four addresses are mapped within partition 232 and to set identifier 1, N−1, 0 and N respectively by verification system 202 (e.g., block 404). The four addresses are depicted in FIG. 7 as storage locations 230 with a grey background.

The verification system 202 may send a cache 108 purge signal to the device under test 210. Utilizing the cache skip switch 300, 301, the device under test 210 identifies and purges memory locations 230. For example, as depicted, device under test 210 may sequentially purge of memory locations 230. In such example, a first memory location 230 identified by the CC=0, Set=0 identifier may be initially identified and purged. Next, the set identifier is incremented and the next sequential memory location 230 in the congruency class identified by the CC=0, Set=1 identifier may be identified and purged. This storage location 230 was pre-loaded with a valid entry and block 422 ensures this storage location 230 is invalid at the end of the cache purge sequence. In this sequential purging of memory locations 230, the device under test 210 may identify and purge set memory locations 230 in congruency class 0, may then identify and purge set memory locations 230 in congruency class 1, and the like, until that last congruency class within the partition 232 or cache 108 (as appropriate) is purged. Though FIG. 7 depicts device under test 210 sequentially purging memory locations 230, device under test 210 may purge memory locations 230 in other order(s), as is known in the art.

When all of the appropriate storage locations 230 are purged, the device under test 210 generates and sends the purge done signal 312 to the verification system 202. The verification system 202 may then check the purged or unloaded entries from the purged storage locations against the know reference model.

Such cache purge verification process may be beneficial over current state of the art techniques which utilize the verification system to artificially advance and/or increment a counter or other component that identifies the addressed storage location to be purged, as opposed to the device under test 210 incrementing the counter 308 that identifies the address storage location to be purged, as is enabled by the present embodiments. Such state of the art techniques may be disadvantageous due to a preference of allowing the device under test to reach its purge done state with artificial intervention. Such state of the art techniques may be further disadvantageous because of the resulting need of the verification environment to read the current state or count of the counter or other component in order for the verification environment to artificially advance to and/or increment to the counter or other component to point to the intended addressed storage location to be purged. Such state of the art techniques may be further disadvantageous because of timing requirements of the artificial advancement of the counter occurring during a specific window of time, or else such artificial advancing may force the device under test into an prohibited or unrealistic state.

Additionally, process 400 may be extended such that after the cache purge command has been received by the device under test 210 (block 432) and either the full cache is purged (block 436) or partially purged (block 438), other commands may be received by the device under test 210 that may alter the cache 108 state and/or the cache line (data) therein. Such commands may modify the cache reference value stored in the cache 108, partition 232, and the updated reference value may be considered during the cache purge check (block 416).

Figure 8:
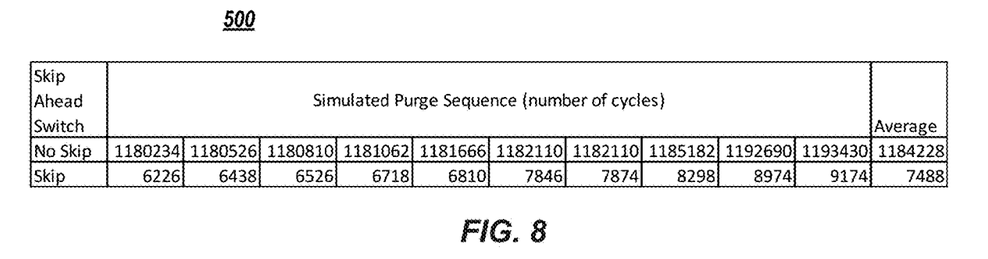
FIG. 8 illustrates a table of the number of cache purge cycles of a cache that includes an enabled and disabled cache skip switch, in accordance with some embodiments.

FIG. 8 illustrates a table 500 of a particular example of a number of cache purges of an exemplarity cache 108 that includes an enabled or active and disabled or inactive cache skip switch 300, 301, in accordance with some embodiments. As is depicted, in this particular cache 108, when the cache skip switch 300, 301 is inactive and configured to purge each storage location 230 within the cache 108, there is an average of 1,184,228 purges across various cache purge simulations. However, when the cache skip switch 300, 301 is active and configured to purge only the storage locations 230 within the partition 232 of cache 108, there is an average of 7,488 purges across various cache purge simulations. In this manner, because partition 232 includes fewer storage locations 230 relative to the entire cache 108, cache purge simulation application 124 performs cache purge simulation, verification, and/or test operations on an effectively smaller cache, thereby reducing the number of cache purges and reduces the overall time to complete the cache purge simulation or test.

The present invention may be a system, a process, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of processes, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, processes, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. A cache purge simulation system comprising:
    a device under test comprising a cache skip switch circuit, the cache skip switch circuit comprising:
    a configurable state register to either indicate whether all of an associated cache is purged upon receipt of a cache purge instruction from a verification system or whether a physical partition that is smaller than the associated cache is purged upon receipt of the cache purge instruction from the verification system; and
    a first multiplexer that outputs either a maximum cache address that identifies a last storage location of the associated cache or a simulation maximum address that identifies a storage location of the associated cache that is between a minimum address that identifies a beginning storage location of the associated cache and the maximum cache address.

2. The cache purge simulation system of claim 1, wherein the cache skip switch circuit defines the physical partition within the associated cache.

3. The cache purge simulation system of claim 1, wherein the cache skip switch circuit further comprises a purge address register that identifies an address of a storage location within the associated cache that is subsequently purged by the device under test.

4. The cache purge simulation system of claim 3, wherein the first multiplexer outputs the maximum cache address or the simulation maximum address depending upon a state specified by the configurable state register.

5. The cache purge simulation system of claim 3, wherein the cache skip switch circuit further comprises a second multiplexer that outputs the minimum address that identifies the beginning storage location of the associated cache to the purge address register if a purge hold signal is true.

6. The cache purge simulation system of claim 3, wherein the cache skip switch circuit further comprises a comparator that compares the output of the first multiplexer with the address identified by the purge address register.

7. The cache purge simulation system of claim 3, wherein the cache skip switch circuit further comprises an incrementor that increments the address identified by the purge address register when the output of the first multiplexer is not equal to the address identified by the purge address register.

8. The cache purge simulation system of claim 2, wherein the physical partition defined by the cache skip switch circuit comprises a subset of the associated cache from the minimum address to the simulation maximum address.

9. A cache purge simulation system comprising:
a device under test comprising a cache skip switch circuit, the cache skip switch circuit comprising:
a configurable start address register comprising a start address that indicates a beginning storage location of a physical partition of an associated cache;
a configurable stop address register comprising a stop address that indicates a ending storage location of the physical partition of the associated cache;
a purge address register comprising a purge address of a storage location within the associated cache that is purged by the device under test; and
a multiplexer that outputs the purge address to the purge address register, wherein only the physical partition of the associated cache is purged upon receipt of a cache purge instruction from a verification system, and wherein the physical partition is smaller than the associated cache.

10. The cache purge simulation system of claim 9, wherein the cache skip switch circuit defines a size of the physical partition within the associated cache.

11. The cache purge simulation system of claim 9, wherein the cache skip switch further comprises a comparator that compares the stop address with the purge address comprised within the purge address register.

12. The cache purge simulation system of claim 9, wherein the cache skip switch circuit further comprises an incrementor that increments the purge address that is outputted by the multiplexer to the purge address register when the stop address is not equal to the purge address comprised within the purge address register.

13. The cache purge simulation system of claim 9, wherein the multiplexer initially outputs the start address to the purge address register.

14. The cache purge simulation system of claim 9, wherein the physical partition defined by the cache skip switch circuit comprises a subset of the associated cache from the start address to the stop address.

15. A cache purge simulation process comprising:
sending, with a verification system, an active skip switch state instruction to a device under test;
sending, with the verification system, a cache purge instruction to the device under test;
purging, with the device under test, storage locations comprised within the physical partition and not purging storage locations within the cache that are not comprised within the physical partition; and
sending, with the device under test, a purge done signal to the verification system.

16. The cache purge simulation process of claim 15, further comprising:
sending, with the verification system, predetermined reference data to the device under test; and
storing the predetermined reference data within an associated predetermined storage location within the physical partition.

17. The cache purge simulation process of claim 16, further comprising:
upon receipt of the purge done signal, obtaining, with the verification system, data stored within the physical partition; and
comparing the obtained data stored within the physical partition with the predetermined reference data.

18. The cache purge simulation process of claim 17, further comprising:
subsequent to purging storage locations comprised within the physical partition, receiving a modifying command that resultantly alters the data stored within the physical partition; and
updating, with the verification system, the cache reference model with the altered data stored within the physical partition.

* * * * *